United States Patent
Koga

(10) Patent No.: US 6,914,309 B2
(45) Date of Patent: Jul. 5, 2005

(54) SEMICONDUCTOR DEVICE WITH DOUBLE SIDEWALL SPACER AND LAYERED CONTACT

(75) Inventor: Hiroki Koga, Tokyo (JP)

(73) Assignees: NEC Corporation, Tokyo (JP); NEC Electronics Corporation, Kawasaki (JP); Hitachi, Ltd., Tokyo (JP)

(*) Notice: Subject to any disclaimer, the term of this patent is extended or adjusted under 35 U.S.C. 154(b) by 0 days.

(21) Appl. No.: 10/251,062

(22) Filed: Sep. 20, 2002

(65) Prior Publication Data

US 2003/0052375 A1 Mar. 20, 2003

(30) Foreign Application Priority Data

Sep. 20, 2001 (JP) .................................. 2001-286140

(51) Int. Cl.[7] .................... H01L 29/76; H01L 29/94; H01L 31/062; H01L 31/113; H01L 31/119
(52) U.S. Cl. ................... 257/382; 257/336; 257/344; 257/408; 257/640
(58) Field of Search ................... 257/336, 344, 257/408, 382–385, 377, 412, 413

(56) References Cited

U.S. PATENT DOCUMENTS

| | | | | |
|---|---|---|---|---|
| 5,324,974 A | * | 6/1994 | Liao ............................ | 257/344 |
| 5,326,714 A | * | 7/1994 | Liu et al. .................... | 438/254 |
| 5,330,929 A | * | 7/1994 | Pfiester et al. .............. | 438/152 |
| 5,780,896 A | * | 7/1998 | Ono .............................. | 257/344 |
| 5,851,890 A | * | 12/1998 | Tsai et al. .................... | 438/303 |
| 6,025,265 A | * | 2/2000 | Miller et al. ................. | 438/634 |
| 6,188,100 B1 | * | 2/2001 | Hermes ....................... | 257/309 |
| 6,287,924 B1 | * | 9/2001 | Chao et al. .................. | 438/300 |
| 6,323,525 B1 | * | 11/2001 | Noguchi et al. ............. | 257/385 |
| 6,326,664 B1 | * | 12/2001 | Chau et al. .................. | 257/344 |
| 6,342,421 B1 | * | 1/2002 | Mitani et al. ................ | 438/300 |
| 6,479,858 B2 | * | 11/2002 | Krivokapic ................... | 257/314 |
| 6,486,506 B1 | * | 11/2002 | Park et al. .................... | 257/314 |
| 6,580,149 B2 | * | 6/2003 | Tran et al. .................... | 257/549 |
| 6,617,654 B2 | * | 9/2003 | Oishi et al. .................. | 257/382 |
| 6,693,333 B1 | * | 2/2004 | Yu ................................ | 257/407 |
| 2002/0000627 A1 | * | 1/2002 | Nguyen ....................... | 257/408 |
| 2004/0056316 A1 | * | 3/2004 | Prall et al. ................... | 257/390 |

* cited by examiner

Primary Examiner—Tom Thomas
Assistant Examiner—Jesse A. Fenty
(74) Attorney, Agent, or Firm—Katten Muchin Zavis Rosenman

(57) ABSTRACT

A semiconductor device has a pair of impurity regions in a semiconductor substrate. A silicon layer is formed on the impurity region. A gate insulating film is formed between the impurity regions. A gate electrode is formed on the gate insulating film. A first silicon nitride film is formed on the gate electrode. A silicon oxide film is formed on a side surface of the gate electrode. A second silicon nitride film is partially formed on the silicon layer and on a side surface of the silicon oxide film. A conductive layer is formed on the silicon layer.

8 Claims, 7 Drawing Sheets

SEMICONDUCTOR DEVICE WITH DOUBLE SIDEWALL SPACER AND LAYERED CONTACT

BACKGROUND OF THE INVENTION

This invention relates to a semiconductor device and a method of manufacturing the same. More specifically, this invention relates to transistors arranged with high-density by the use of silicon selective growth technique and contact formation technique based on self-alignment, and a method of manufacturing the same.

In order to achieve high-density in the semiconductor device, the recent trend is directed to the miniaturization technique of the devices. For achieving the device with a greater scale of high-density, a mask alignment margin between a contact and an underlayer wiring pattern has been reduced.

As a method of reducing such mask alignment margin, a technique for forming the contact by the use of the self-alignment is exemplified.

In the technique, the underlayer wiring pattern is covered with a silicon nitride film and the contact is opened by etching having a high-etching selective ratio between the silicon oxide film as an interlayer insulating film and the silicon nitride film for protecting the underlayer wiring pattern. Such conventional technique is disclosed in, for example, Japanese Unexamined Patent Publication (JP-A) No. Hei. 9-213949.

Referring now to FIGS. 1A through 1E, the conventional technique will be described below.

At first, a gate oxide film 2 is deposited on a semiconductor substrate 1 as illustrated in FIG. 1A. Thereafter, a polysilicon film 3 and a silicon nitride film 24 are sequentially deposited thereon, and an unnecessary portion is removed by the use of photolithography and anisotropic dry etching. Thereby a gate electrode made of the polysilicon film 3 is formed such that the silicon nitride film 24 is laminated or stacked thereon. Next, a low-concentration impurity region 10 is formed on the semiconductor substrate 1 by using ion implantation.

Successively, a silicon nitride film 5 is deposited on a whole surface, as illustrated in FIG. 1B.

Then the silicon nitride film 5 is partially etch-backed by the use of the anisotropic dry-etching such that a sidewall film 6 is left only on a sidewall portion of the gate electrode, as illustrated in FIG. 1C. Thereafter, a high-concentration impurity region 11 is formed by the ion implantation.

Successively, an interlayer insulating film 7 as the silicon oxide film is entirely deposited thereon, and a contact hole 8 is opened by removing an unnecessary portion by the use of the photolithography and the anisotropic dry-etching, as illustrated in FIG. 1D.

In such anisotropic dry-etching, an etching rate of the silicon nitride film is lower than that of the silicon oxide film so that an etching selective ratio becomes higher.

As a consequence, even when an upper opening dimension of the contact hole 8 is larger than a space between the sidewall films 6 of adjacent gate electrodes, the gate electrode is protected by the silicon nitride film 24 and the sidewall film 6 so that the gate electrode is not electrically shorted with a wiring layer 9 which will be formed later.

Next, a conductive film is deposited on the whole surface, and the wiring layer 9 is formed by removing an unnecessary portion by the photolithography as well as the anisotropic dry-etching, as illustrated in FIG. 1E.

In the above-described conventional technique, however, the silicon nitride film, which readily traps a hot electron, is used as the sidewall film 6 of the gate electrode. Consequently, a transistor characteristic is easily deteriorated. The above-mentioned conventional publication also discloses a method of solving such a problem, and this method will be explained with reference to FIGS. 2A through 2G.

At first, the gate oxide film 2 is deposited on the semiconductor substrate 1, as illustrated in FIG. 2A. Thereafter, the polysilicon film 3 and the silicon nitride film 4 are sequentially deposited thereon, and an unnecessary portion is removed by the photolithography and the anisotropic dry-etching. Thus, the gate electrode as the polysilicon film 3, on which the silicon nitride film 4 is laminated, is formed.

Next, the low-concentration impurity region 10 is formed in the semiconductor substrate 1 by the ion implantation.

Subsequently, the silicon oxide film 12 is deposited on the whole surface, as illustrated in FIG. 2B.

Successively, the silicon oxide film 12 is partially etch-backed by the use of the anisotropic dry-etching so that a first sidewall film 13 is left only on the sidewall portion of the polysilicon film 3 as the gate electrode, as illustrated in FIG. 2C.

In such anisotropic dry-etching, the etching selective ratio between the silicon oxide film and the silicon nitride film becomes high. As a result, while the first sidewall film 13 has the substantially same height as that of the polysilicon film 3 by adjusting etching time, a film thickness of the silicon nitride film 4 on the polysilicon film 3 is not largely reduced. Thereafter, the high-concentration impurity region 11 is formed by using the ion implantation.

Subsequently, the silicon nitride film 15 is deposited on the whole surface with the substantially same film thickness as that of the sidewall film 13, as illustrated in FIG. 2D.

Next, the silicon nitride film 15 is partially etch-backed by using the anisotropic dry-etching so that a second sidewall film 16 is left only on the sidewall portion of the silicon nitride film 4 on the gate electrode and the polysilicon film 3 as the gate electrode, as illustrated in FIG. 2E. In this event, the etching time is adjusted such that the silicon nitride film 15 is not left on the side surface of the first sidewall film 13.

Successively, the interlayer insulating film 7 as the silicon oxide film is deposited on the whole surface, and the contact hole 8 is opened by removing an unnecessary portion by the use of the photolithography and the dry-etching, as illustrated in FIG. 2F.

In such anisotropic dry-etching, the etching selective ratio between the silicon oxide film and the silicon nitride film is selected to a high value. Thereby, even if the upper opening of the contact hole 8 has the dimension larger than the space between the sidewall films 6 of the adjacent gate electrodes, the gate electrode is protected by the silicon nitride film 4, the first sidewall film 13 and the second sidewall film 16. As a consequence, the gate electrode is not electrically shorted with the wiring film which will be formed later.

Next, the conductive film is deposited on the whole surface, and the wiring layer 9 is formed by removing an unnecessary portion by using the photolithography and the anisotropic dry-etching, as illustrated in FIG. 2G.

By employing the above-described technique, both the first sidewall film 13 and the second sidewall film 16 are placed between the polysilicon film 3 as the gate electrode and the wiring layer 9. In consequence, even when the dimension of the upper opening of the contact hole 8 is larger than the space between the sidewall films of the adjacent gate electrodes, the gate electrode is not electrically shorted with the wiring layer 9.

Further, the lower portion of the sidewall film of the gate electrode is formed of the silicon oxide film. Thereby, the hot carrier can not be readily trapped as compared with the case of the silicon nitride film. Therefore, the transistor characteristic is not easily deteriorated.

Upon formation of the second sidewall film 16, the etch-back must be carried out so that the silicon nitride film 15 formed on the side surface of the first sidewall film 13 is completely removed.

However, the silicon nitride film 15 may be partially left on the side surface of the first sidewall film 13 in the practical use in the cause of variation of the film thickness of the silicon nitride film 15 and variation of the anisotropic dry-etching rate upon etch-back.

Under such circumstances, the bottom portion of the contact hole 8 becomes smaller in dimension than the predetermined value, so that contact resistance is increased inevitably.

Upon the etch-back of the silicon nitride film 15, the surface of the high-concentration impurity region 11 is subjected to etch-back atmosphere during long time, resulting in etching damage. As a consequence, the transistor characteristic is degraded.

In addition, the first sidewall film 13 is formed of the silicon oxide film. Therefore, the first sidewall film 13 is also etched in a step of processing hydrofluoric acid chemical liquid for removing a natural oxide film on the bottom portion of the contact before forming the wiring layer. Consequently, the polysilicon film 3 may be electrically shorted with the wiring layer 6

Depending upon the kinds of products, only the low concentration impurity regions 10 are used as source/drain regions of the transistor but the high concentration impurity regions may be not formed.

For example, a dynamic random access memory (DRAM) adopts such a structure in order to reduce a leak current in a reverse direction at a PN junction between an N-type low concentration impurity regions 10 as source/drain regions and a P-well region in many cases.

With this structure, it is difficult to employ metal material for the wiring layer 9. This reason will be explained below. Namely, in case where a silicide layer as compound of metal and silicon is formed between the wiring layer 9 and the low concentration impurity region 10, a depletion layer formed at the PN junction is widely extended towards an N-side so that the silicide layer is entrapped inside the depletion layer.

The silicide layer can serves as a generation recombination center, that is, a GR center, and therefore, the leak current in the reverse direction is increased. The wiring layer 9 is often made of the polysilicon such that no silicide layer is formed between the wiring layer 9 and the low concentration impurity region 10. In this case, the contact resistance is increased in comparison with the metal wiring layer.

SUMMARY OF THE INVENTION

It is therefore an object of this invention to provide a semiconductor device which has a contact formed by a self-alignment with low resistance and in which a transistor characteristic is not readily deteriorated, and a method of manufacturing the same.

Other objects of this invention will become clear as the description proceeds.

According to a first aspect of this invention, there is provided a semiconductor device having a pair of impurity regions in a semiconductor substrate, comprising:

a silicon layer which is formed on the impurity region;

a gate insulating film which is formed between the impurity regions;

a gate electrode which is formed on the gate insulating film;

a first silicon nitride film which is formed on the gate electrode;

a silicon oxide film which is formed on a side surface of the gate electrode;

a second silicon nitride film which is partially formed on the silicon layer and which is formed on a side surface of the silicon oxide film; and a conductive layer which is formed on the silicon layer.

Preferably, the gate electrode is made of a polysilicon layer and a metal layer or a metal silicide layer.

Preferably, the silicon oxide film and the second silicon nitride film constitute a double sidewall spacer.

Preferably, the silicon layer is insulated from the gate electrode only by the silicon oxide film, and a lower edge of the second nitride film contacts with an upper surface of the silicon layer.

Preferably, the conductive layer is insulated from the gate electrode by the first silicon nitride film and the double sidewall spacer.

Preferably, a silicide layer is placed between the conductive layer and the silicon layer.

Preferably, a depletion layer is formed near the impurity region, and the silicon layer serves so as to prevent the depletion layer from reaching the titanium silicide layer.

According to a second aspect of this invention, there is provided a method of manufacturing a semiconductor device, comprising the steps of:

forming a gate insulating film on the semiconductor substrate;

forming a gate electrode on the gate insulating film;

forming a first silicon nitride film on the gate electrode;

forming a silicon oxide film at a side surface of the gate electrode;

forming impurity regions at both sides of the gate electrode in the semiconductor substrate;

forming a silicon layer on the impurity region;

partially forming a second silicon nitride film on the silicon layer at a side surface of the silicon oxide film; and forming a conductive layer on the silicon layer.

Preferably, the gate electrode is formed of a polysilicon layer and a metal layer or a metal silicide layer.

Preferably, the silicon layer is selectively grown on the impurity region by selective epitaxial growth.

The method further may comprise the following steps of:

forming a titanium/titanium nitride lamination film on the silicon layer; and forming a titanium silicide layer on the silicon layer by thermal treatment.

Preferably, depletion layer is formed near the impurity region, and the silicon layer serves so as to prevent the depletion layer from reaching the titanium silicide layer.

Preferably, the silicon oxide film and the second silicon nitride film constitute a double sidewall spacer.

Preferably, a hot carrier is generated at an edge of the impurity region, and a distance between the edge of the impurity region and the second silicon nitride film is selected such that the hot carrier is not trapped in the second silicon nitride film.

According to a third aspect of this invention, there is provided a method of manufacturing a semiconductor device, comprising the steps of:

forming a gate insulating film on the semiconductor substrate;

sequentially forming a polysilicon film and a metal film or a metal silicide film and a first silicon nitride film on the semiconductor substrate;

forming a gate electrode by removing an unnecessary portion by lithography and anisotropic dry-etching;

oxidizing at least a side surface of the polysilicon film in oxidation atmosphere;

exposing a surface of the silicon substrate by etch-baking an oxide film by anisotropic dry etching;

forming source/drain regions by ion-implantation;

growing silicon layers on the source/drain regions by a silicon selective growth;

entirely growing a second silicon nitride film;

exposing the silicon layer by etch-backing the second silicon nitride film by anisotropic dry etching;

forming an interlayer insulating film made of a silicon oxide film; and opening a contact hole by lithography and dry-etching.

According to this invention, the distance between the edge of the drain region and the sidewall spacer becomes large. Herein, the hot carrier is readily generated at the edge of the drain region while the sidewall spacer is made of the silicon nitride film. Under this circumstance, the transistor characteristic is not deteriorated because no hot carrier is trapped inside the sidewall spacer.

In addition, the depletion layer formed at the PN junction is largely extended towards the N–type impurity region. However, the depletion layer is prevented from being extended and does not reach the titanium silicide layer because the silicon formed on the impurity region is the N+type region including phosphorous with $1E20/cm^3$. As a consequence, the silicide layer does not proceed inside the depletion layer, so that the leak current in the reverse direction is not increased.

DESCRIPTION OF PREFERRED EMBODIMENTS

Figure 1A:
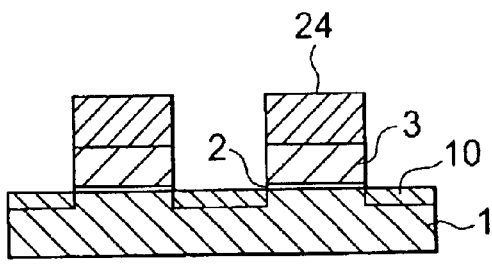
FIGS. 1A through 1E are cross sectional views explaining the conventional contact formation technique by self-alignment.
Figure 1B:
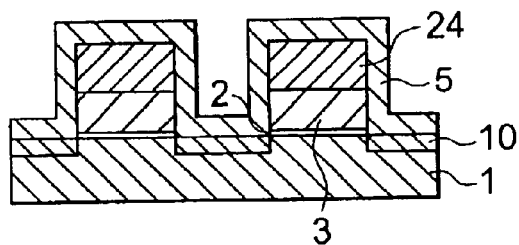
Figure 1C:
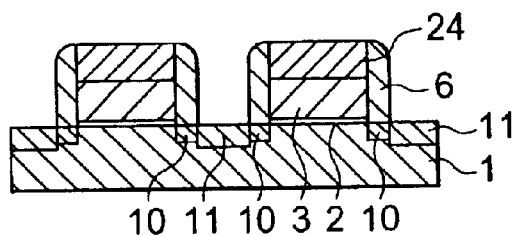
Figure 1D:
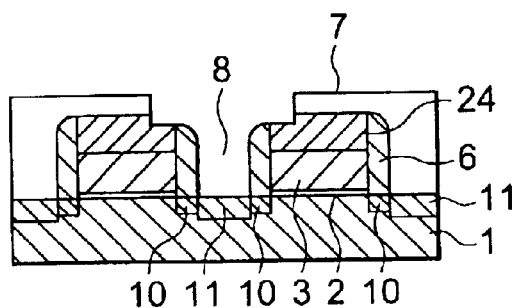
Figure 1E:
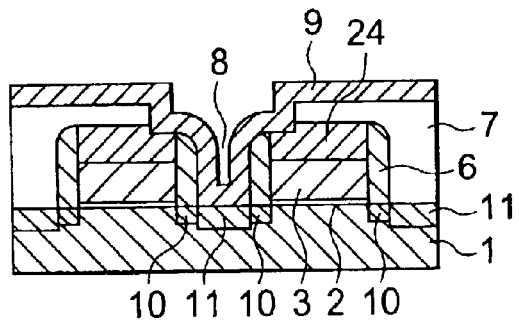
Figure 2A:
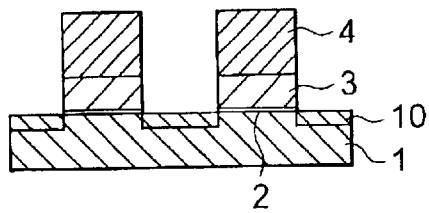
FIGS. 2A through 2G are cross sectional views showing a method of manufacturing the conventional semiconductor device.
Figure 2B:
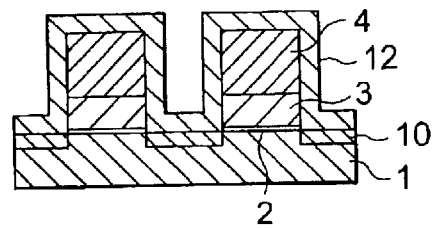
Figure 2C:
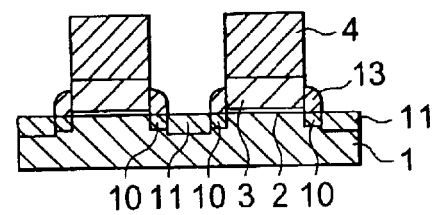
Figure 2D:
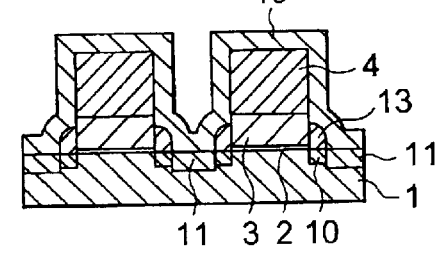
Figure 2E:
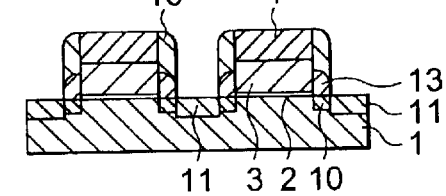
Figure 2F:
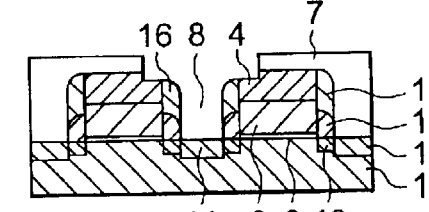
Figure 2G:
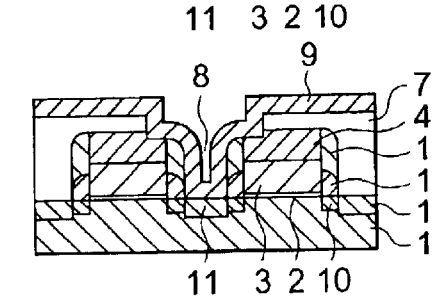
Figure 3:
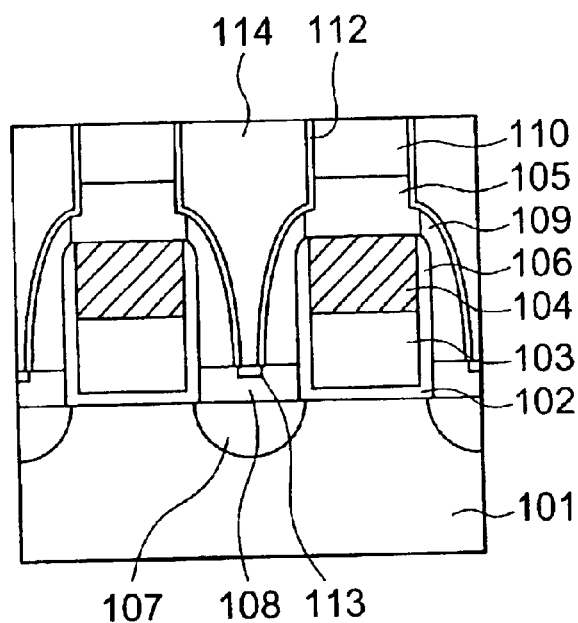
FIG. 3 is a cross sectional view showing a semiconductor device according to this invention.
Figure 4:
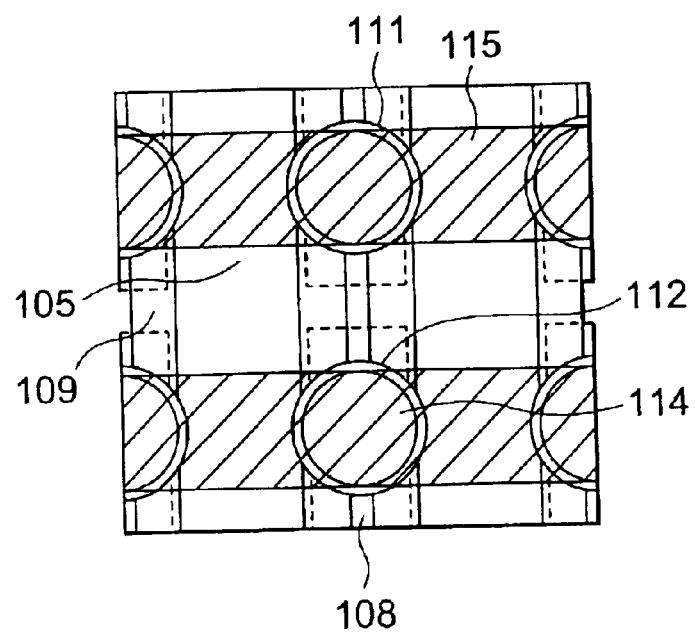
FIG. 4 is a plan view showing a semiconductor device according to this invention.

Referring to FIGS. 3 and 4, description will be made about a semiconductor device such as a field effect transistor (FET) according to this invention.

A semiconductor device (a field effect transistor) comprises a gate electrode made of a polysilicon 103 and a tungsten silicide 104 placed on a semiconductor substrate 101 via a gate insulating film 102, an impurity region 107, and a silicon layer 108 grown selectively only on the impurity region 107.

With such a structure, a double sidewall spacer consisting of a silicon oxide film 106 and a second silicon nitride film 109 is entirely or partially arranged on the side surface of the gate electrode of the transistor. The grown silicon layer 108 is insulated from the gate electrode only by the silicon oxide film 106 as the sidewall spacer while the lower edge of the second silicon nitride film 109 as the sidewall spacer contacts with the upper surface of the silicon nitride film 108.

A conductive layer (for example, a tungsten layer) 114 filling a contact hole 111 is insulated from the gate electrode by a first silicon nitride film 105 placed over the gate electrode and the sidewall spacer.

On the first silicon nitride film 105, a silicon oxide film 110 is placed, and the conductive layer 114 is covered with a titanium/titanium nitride lamination film 112. A titanium silicide 113 is arranged between the conductive layer 114 and the silicon layer 108.

Referring to now to FIGS. 5A through 5F and FIG. 6A through 6F, description will be made about a method of manufacturing a semiconductor device according to a first embodiment of this invention.

Figure 5A:
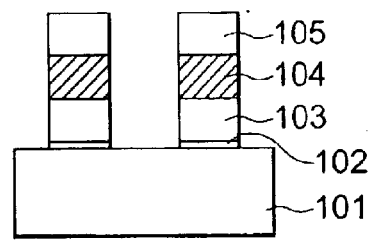
FIGS. 5A through 5F are cross sectional views showing a method of manufacturing a semiconductor device according to a first embodiment of this invention.
Figure 6A:
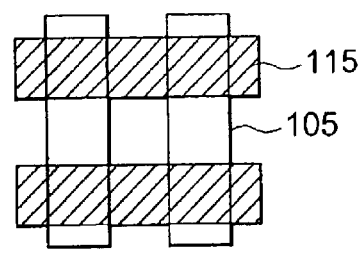
FIGS. 6A through 6F are plan views showing a method of manufacturing a semiconductor device according to a first embodiment of this invention.

The surface of the semiconductor substrate 101 is thermally oxidized to a thickness of 5 nm to thereby form the gate oxide film 102, as illustrated in FIGS. 5A and 6A. Thereafter, a polysilicon film including phosphorus is grown to a thickness of 100 nm by CVD (Chemical Vapor Deposition), and successively, the tungsten silicide 104 is grown by the use of CVD or sputtering.

Subsequently, the first silicon nitride film 105 is deposited to a thickness of 100 nm by the CVD. Unnecessary portions of the first silicon nitride film 105, the tungsten silicide 104 and polysilicon film 103 are removed to thereby form the gate electrode.

Figure 5B:
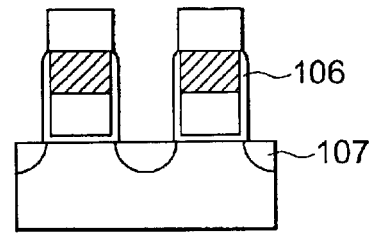
Figure 6B:
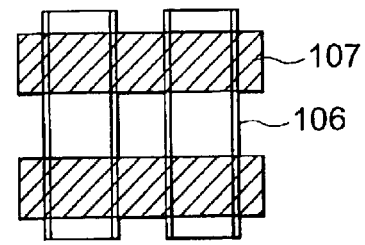

Next, the polysilicon film 103 patterned by the thermal oxidation and the tungsten silicide patterned are oxidized on the side surface to thereby form the silicon oxide film 106 to a thickness of about 10 nm, as illustrated in FIGS. 5B and 6B.

Successively, the gate oxide film 102 formed on the silicon substrate between the gate electrodes is etch-backed by the use of the anisotropic etching to thereby expose the surface of the silicon substrate 101. Thereafter, phosphorus ions are implanted with $1E13/cm^2$ under energy of 30 keV to thereby form the impurity region as the drain region.

Figure 5C:
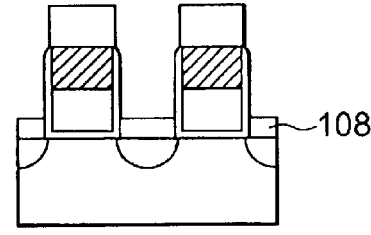
Figure 5D:
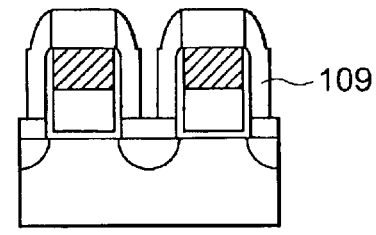
Figure 6C:
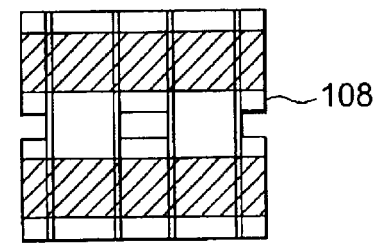
Figure 6D:
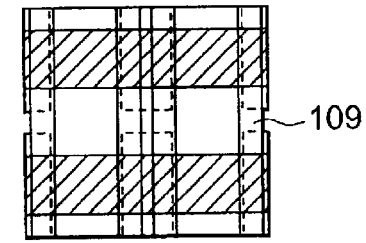

Subsequently, the silicon layer 108 including phosphorus with $1E20/cm^3$ is grown to a thickness of about 50 nm on the impurity region 107 by using selective epitaxial silicon growth, as illustrated in FIGS. 5C and 6C.

Successively, the second silicon nitride film 109 is deposited on the whole surface by the CVD, as illustrated in FIGS.

3D and 4D. The film thickness of the second silicon nitride film 109 is preferably adjusted such that the second silicon nitride film 109 does not bury between the gate electrodes. For example, if the space between the gate electrodes is equal to 150 nm, the second silicon nitride film 109 has the thickness of about 50 nm. Next, the second silicon nitride film 109 selectively grown on the silicon 108 is etch-backed by the use of the anisotropic etching to thereby expose out the surface of the silicon layer 108.

Figure 5E:
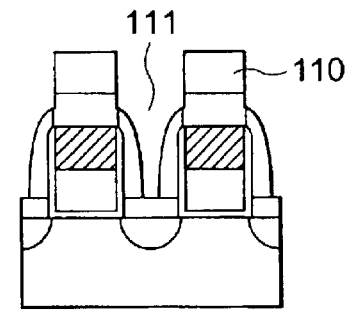
Figure 6E:
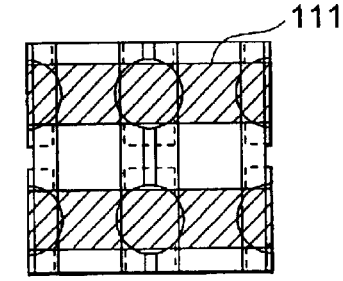

Thereafter, the silicon oxide film 110 is deposited thereon to a thickness of 500 nm by the CVD, and the surface thereof is flattened by the use of CMP (Chemical Mechanical Polishing), as illustrated in FIGS. 5E and 6E. Next, the contact hole 111 is opened by removing an unnecessary portion of the silicon oxide film 110 by the lithography and the anisotropic dry etching.

In such anisotropic etching, the silicon oxide film has an etching rate slower than that of the silicon nitride film. Thereby, even if the dimension of the upper portion of the contact hole 111 is larger than the space between the gate electrodes, the gate electrode is not partially exposed inside the contact hole 111 because the gate electrode is covered with the first silicon nitride film 105 and the second silicon nitride film 109, as illustrated in FIGS. 6E and 6E.

Figure 5F:
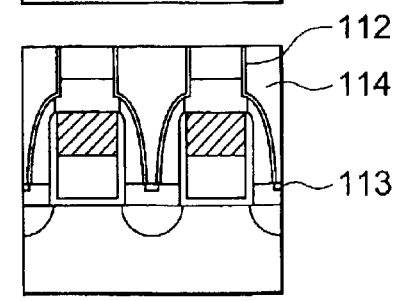
Figure 6F:
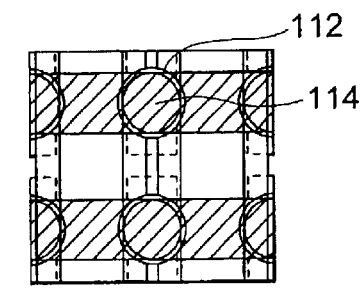

Subsequently, titanium and titanium nitride are grown to 10 nm by the CVD or the sputtering, respectively, and thereby, the titanium/titanium nitride lamination film 112 is formed, as illustrated in FIGS. 5F and 6F. Thereafter, a thermal treatment is carried out at 700° C. for 30 seconds, and as a result, the titanium reacts with the silicon to thereby form a titanium silicide layer 113. Next, the conductive layer 114 made of tungsten is deposited to 300 nm by the CVD, and successively, unnecessary portions of the conductive layer 114 and the titanium/titanium nitride lamination film 112 are removed by the CMP.

Referring to FIGS. 7A through 7G and FIG. 8A through 8G, description will be made about a method of manufacturing a semiconductor device according to a second embodiment of this invention.

Figure 7A:
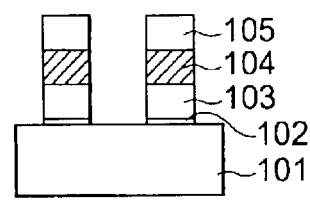
FIGS. 7A through 7G are cross sectional views showing a method of manufacturing a semiconductor device according to a second embodiment of this invention.
Figure 8A:
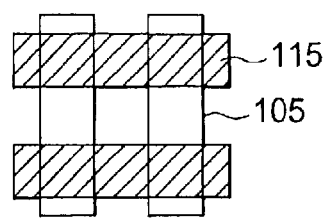
FIGS. 8A through 8G are plan views showing a method of manufacturing a semiconductor device according to a second embodiment of this invention.

The surface of the semiconductor substrate 101 is thermally oxidized to a thickness of 5 nm to thereby form the gate oxide film 102, as illustrated in FIGS. 7A and 8A. Thereafter, the polysilicon film including phosphorus is grown to a thickness of 100 nm by the CVD, and successively, the tungsten silicide 104 is grown by the use of the CVD or the sputtering.

Subsequently, the first silicon nitride film 105 is deposited to a thickness of 100 nm by the CVD. Unnecessary portions of the first silicon nitride film 105, the tungsten silicide 104 and polysilicon film 103 are removed to thereby form the gate electrode.

Figure 7B:
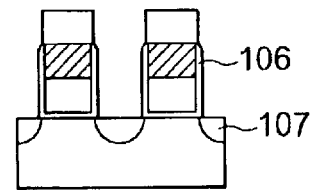
Figure 8B:
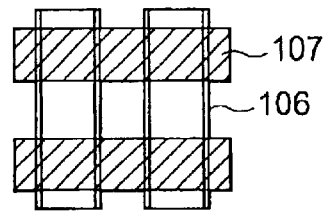

Next, the polysilicon film 103 patterned by the thermal oxidation and the tungsten silicide 104 patterned are oxidized on the side surface to thereby form the silicon oxide film 106 to a thickness of about 10 nm, as illustrated in FIGS. 7B and 8B.

Successively, the gate oxide film 102 formed on the silicon substrate 101 between the gate electrodes is etch-backed by the use of the anisotropic etching to thereby expose out the surface of the silicon substrate 101. Thereafter, phosphorus ions are implanted with $1E13/cm^2$ under energy of 30 keV to thereby form the impurity regions as the source/drain regions.

Figure 7C:
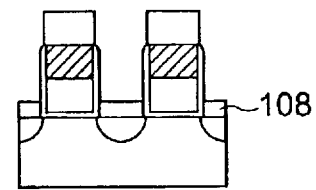
Figure 8C:
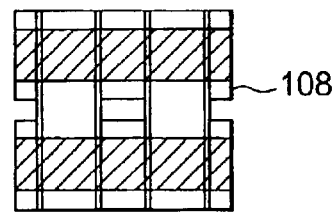

Subsequently, the silicon layer 108 including phosphorus with $1E20/cm^3$ is grown to a thickness of about 50 nm on the impurity region 107 by using the selective epitaxial silicon growth, as illustrated in FIGS. 7C and 8C.

Figure 7D:
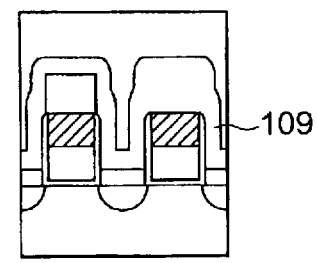
Figure 8D:
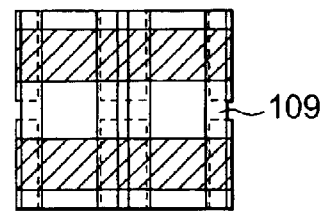

Successively, the second silicon nitride film 109 is deposited on the whole surface by the CVD, as illustrated in FIGS. 7D and 8D. The film thickness of the second silicon nitride film 109 is preferably selected such that the second silicon nitride film 109 does not bury between the gate electrodes. For example, if the space of the gate electrodes is equal to 150 nm, the second silicon nitride film 109 has the thickness of about 50 nm. Next, a silicon oxide film 110 is deposited to 500 nm by the CVD, and the surface is flattened by the CMP.

Figure 7E:
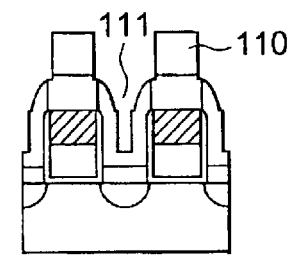
Figure 8E:
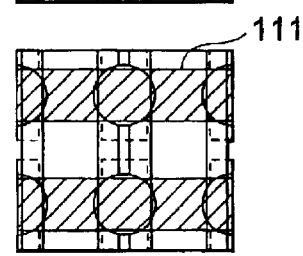

Next, an unnecessary portion of the silicon oxide film 110 is removed by the lithography and the anisotropic dry-etching, as illustrated in FIGS. 7E and 8E.

In such anisotropic etching, the silicon oxide film 110 has an etching rate slower than that of the silicon nitride film. Thereby, even if the dimension of the upper portion of the contact hole 111 is larger than the space between the gate electrodes, the gate electrode is not partially exposed out because the gate electrode is covered with the first silicon nitride film 105 and the second silicon nitride film 109, as illustrated in FIGS. 7E and 8E.

Figure 7F:
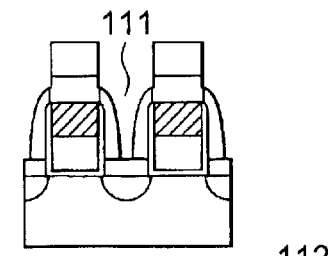
Figure 8F:
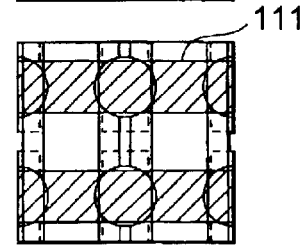

Successively, the second silicon nitride film 109 on the silicon layer 108 grown selectively by the anisotropic dry-etching is etch-backed to thereby expose out the surface of the silicon layer 108, as illustrated in FIGS. 7F and 8F.

Figure 7G:
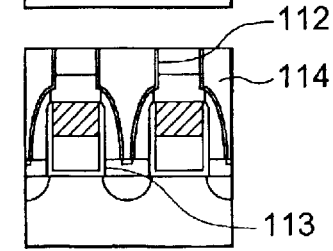
Figure 8G:
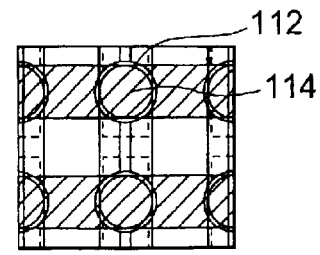

Subsequently, titanium and titanium nitride are grown to 10 nm by the CVD or the sputtering, respectively, and thereby, a titanium/titanium nitride lamination film 112 is formed, as illustrated in FIGS. 7G and 8G. Thereafter, a thermal treatment is carried out at 700° C. for 30 seconds, and as a result, the titanium reacts with the silicon to thereby form the titanium silicide layer 113. Next, the conductive layer 114 made of tungsten is deposited to 300 nm by the CVD, and successively, unnecessary portion of the conductive layer 114 and the titanium/titanium nitride lamination film 112 are removed by the use of the CMP.

While this invention has thus far been disclosed in conjunction with several embodiments thereof, it will be readily possible for those skilled in the art to put this invention into practice in various other manners.

For example, according to the above-described embodiments, the gate electrode is made of the polysilicon 103 and the tungsten silicide 104. However, this invention is not restricted to such a structure, and the gate electrode may be made of other materials as long as the polysilicon layer and the metal layer or the metal silicide layer are employed. For example, the tungsten may be employed as the metal layer while the titanium silicide may be used as the other silicide layer.

What is claimed is:

1. A semiconductor device having a pair of impurity regions in a semiconductor substrate, comprising:

a gate insulating film which is formed between the impurity regions;

a gate electrode which is formed on the gate insulating film;

a first silicon nitride film which is formed on the gate electrode;

a sidewall which is formed only by a silicon oxide film so as to reach to a surface of the semiconductor substrate and which is formed on a side surface of the gate electrode;

a silicon layer which is selectively formed on the impurity region so as to contact with a surface of the sidewall;

a second silicon nitride film which is formed partially on the silicon layer and partially on a side surface of the silicon oxide film; and a conductive layer which is formed on the silicon layer, the first silicon nitride film, and the second silicon nitride film, a conductive film being formed between said conductive layer and said first silicon nitride film.

2. A device as claimed in claim 1, wherein:

the gate electrode is made of a polysilicon layer and a metal layer or a metal silicide layer.

3. A device as claimed in claim 1, wherein:

the silicon oxide film and the second silicon nitride film constitute a double sidewall spacer.

4. A device as claimed in claim 3, wherein:

the silicon layer is insulated from the gate electrode only by the silicon oxide film at a lower portion of the gate electrode, and the conductive layer is insulated from the gate electrode by the double sidewall spacer at an upper portion of the gate electrode.

5. A device as claimed in claim 1, wherein:

a silicide layer is formed between the conductive layer and the silicon layer, and in contact with the silicon layer.

6. A device as claimed in claim 1, wherein:

a titanium silicide layer is formed between the conductive layer and the silicon layer, and is in contact with the silicon layer.

7. A device as claimed in claim 6, wherein:

a depletion layer is formed near the impurity region so that the silicon layer prevents the depletion layer from reaching the titanium silicide layer.

8. A device as claimed in claim 1, wherein:

no silicon nitride film is present near a region where the gate electrode and the impurity region are adjacent to each other.

* * * * *